(12) United States Patent
Muto et al.

(10) Patent No.: US 8,130,504 B2
(45) Date of Patent: *Mar. 6, 2012

(54) METHOD OF MANUFACTURING A FLEXIBLE PRINTED CIRCUIT BOARD, AN OPTICAL TRANSMITTER RECEIVER MODULE, AND AN OPTICAL TRANSMITTER RECEIVER

(75) Inventors: Akira Muto, Tokyo (JP); Tomokazu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 12/749,255

(22) Filed: Mar. 29, 2010

(65) Prior Publication Data

US 2010/0175251 A1    Jul. 15, 2010

Related U.S. Application Data

(63) Continuation of application No. 11/586,209, filed on Oct. 24, 2006, now Pat. No. 7,688,594.

(30) Foreign Application Priority Data

Oct. 31, 2005    (JP) ................................ 2005-317101

(51) Int. Cl.
*H05K 1/00*    (2006.01)
(52) U.S. Cl. ........ 361/749; 361/750; 361/794; 361/795; 29/832; 29/846; 174/254; 174/262
(58) Field of Classification Search ............ 29/832–834, 29/840–846
See application file for complete search history.

(56) References Cited

U.S. PATENT DOCUMENTS

| | | | |
|---|---|---|---|
| 5,418,691 | A | 5/1995 | Tokura |
| 6,326,553 | B1 | 12/2001 | Yim et al. |
| 6,812,411 | B2 | 11/2004 | Belau et al. |
| 7,525,816 | B2 | 4/2009 | Sawachi |
| 2001/0054512 | A1 | 12/2001 | Belau et al. |

FOREIGN PATENT DOCUMENTS

| | | |
|---|---|---|
| JP | 09-298365 | 11/1997 |
| JP | 11-186686 | 7/1999 |
| JP | 11-330808 | 11/1999 |
| JP | 2002-050423 | 2/2002 |
| JP | 2002-134861 | 5/2002 |
| JP | 2003-224408 | 8/2003 |
| JP | 2004-319629 | 11/2004 |

*Primary Examiner* — Tuan T Dinh
(74) *Attorney, Agent, or Firm* — Robert J. Depke; Rockey, Depke & Lyons, LLC

(57) ABSTRACT

A method of manufacturing a flexible printed circuit board having an insulation layer, a first signal wiring layer including a microstrip line, a second signal wiring layer including a signal connection terminal for allowing the microstrip line to connect the exterior connector electrically, and a ground conductive section having a ground connection terminal for connecting the exterior connector. The microstrip line and the signal connection terminal are connected to each other by a wiring via hole. The wiring via hole passes through the insulation layer, the first signal wiring layer, and the second signal wiring layer. The microstrip line has a taper section which gradually enlarges a width of the microstrip line toward the wiring via hole in the vicinity of the wiring via hole. The ground conductive section that corresponds to the microstrip line has a taper section with a shape matching the taper section of the microstrip line.

8 Claims, 17 Drawing Sheets

METHOD OF MANUFACTURING A FLEXIBLE PRINTED CIRCUIT BOARD, AN OPTICAL TRANSMITTER RECEIVER MODULE, AND AN OPTICAL TRANSMITTER RECEIVER

CROSS REFERENCE TO RELATED APPLICATIONS

The subject matter of application Ser. No. 11/586,209 is incorporated herein by reference. The present application is a Continuation of U.S. Ser. No. 11/586,209, filed Oct. 24, 2006, now U.S. Pat. No. 7,688,594 issued May 30, 2010, which claims priority to Japanese Patent Application JP 2005-317101 filed in the Japanese Patent Office on Oct. 31, 2005, the entire contents of which being incorporated herein by reference.

BACKGROUND OF THE INVENTION

1. Field of the Invention

The present invention relates to a flexible printed circuit board, and to an optical transmitter-receiver module and an optical transmitter-receiver which are each equipped with such a flexible printed circuit board.

2. Description of Related Art

For electrically connecting a flexible printed circuit board with other types of board or the like, a method has been used to connect them by means of a connector for connecting the flexible printed circuit board. Further, for transmitting high-frequency signals over a printed circuit board, a printed circuit board with a microstrip line structure has been employed.

FIGS. 1-4 are explanatory illustrations of a structure of a flexible printed circuit board 50 as related art, which is electrically connected to a connector. FIG. 1 is a plan view of the flexible printed circuit board 50 for showing an outline thereof, in which parts of its configuration is, for purposes of clarification, indicated in a transparent state by a broken line. FIG. 2 is a sectional view of the flexible printed circuit board 50 taken along lines M-M of FIG. 1 for illustrating an outline thereof. FIG. 3 is a plan view of a first wiring layer 3, described later, of the flexible printed circuit board 50, as viewed from an upper side in FIG. 2. FIG. 4 is a plan view of a second wiring layer 5, described later, of the flexible printed circuit board 50, as viewed from a lower side in FIG. 2. Further, FIG. 5 is a cross-sectional view of the flexible printed circuit board 50, a printed circuit board 18, and a flexible printed circuit (FPC) connector 7 mounted on the printed circuit board 18 for illustrating a condition where the flexible printed circuit board 50 is connected to the FPC connector 7. It is to be noted that the flexible printed circuit board 50 is illustrated as one shown in FIG. 5 with it being taken along the lines M-M of FIG. 1 and the printed circuit board 18 is shown only partially.

As shown in FIGS. 1-4, the flexible printed circuit board 50 is formed by alternately laminating vertically the first, second and third insulation layers 2, 4, 6 and the first and second wiring layers 3, 5. The first insulation layer 2 and the third insulation layer 6 are made of, for example, a cover lay as a protection film. In a predetermined region of an end of the flexible printed circuit board 50, for purposes of making electrical connection with the FPC connector 7, the third insulation layer 6 is in an unformed state. On an upper surface of the first insulation layer 2, a cover plate 53 is provided to prevent any damage from occurring at times of making connection with the FPC connector 7.

As shown in FIGS. 1 and 3, on the first wiring layer 3, a solid pattern ground layer 12b is formed. As shown in FIGS. 1 and 4, signal connection pads 52 for connection of a signal line 9, which will be described later, are equipped at a portion of the second wiring layer 5 that is in the vicinity of the end of the board, as connection pads for electrical connection with the FPC connector 7. Ground connection pads 51 for connection of the ground layer 12b are also equipped at a portion of the second wiring layer 5 that is in the vicinity of the end of the flexible printed circuit board 50, as connection pads for electrical connection with the FPC connector 7. Each of the ground connection pads 51 is connected to the ground layer 12b that is formed on the first wiring layer 3, via a ground via hole 54 passing through the flexible printed circuit board 50. Further, on the second wiring layer 5, a pair of signal lines 9c and 9d, which are microstrip lines, are wired in such a way that they can be respectively connected to the signal connection pad 52.

Further, as shown in FIG. 5, the FPC connector 7 is mounted on the printed circuit board 18, which includes a signal wiring layer 18a, an insulation layer 18b, and a ground layer 18c, and is connected to the flexible printed circuit board 50. The FPC connector 7 includes a resin-made housing 36 and a predetermined number of metal-made contacts 35 within the housing 36, each contact being constituted of an FPC connection section 35a that comes into contact with the connection pads of the flexible printed circuit board 50, a support section 35c for supporting the housing 36, and a lead section 35b to be connected to the printed circuit board 18. The metal-made contacts 35 are arranged in parallel to each other with predetermined spacing therebetween. Spacing between the connection pads of the flexible printed circuit board 50 correspond to spacing between the contacts 35.

The contacts 35 of the FPC connector 7 are respectively soldered to connection pads, not shown, which are formed on the outermost signal wiring layer 18a of the printed circuit board 18 at a position of the lead section 35b of each of the contacts 35, which is indicated by P. The connection pads of the printed circuit board 18 are respectively connected to a signal line or a ground pattern, neither of which is shown. The signal line or the ground pattern is formed on the signal wiring layer 18a of the printed circuit board 18.

The FPC connector 7 shown in FIG. 5 is of a so-called lower-contact type, so that the flexible printed circuit board 50 is thus connected to the FPC connector 7 in a condition where the connection pads of the flexible printed circuit board 50 are positioned toward a lower surface thereof, as indicated by O.

In such a configuration, a high-frequency signal current flows through the signal lines 9 on the flexible printed circuit board 50, the contact 35 of the FPC connector 7 that corresponds to each of the signal lines 9, and the signal line formed on the printed circuit board 18. At this time, a feedback current for the signal current flows in an opposite direction thereto through the ground layer 12b on the flexible printed circuit board 50, through the ground via hole 54, through the contact 35 of the FPC connector 7 that corresponds to a ground line, and through the ground layer 18c on the printed circuit board 18. FIG. 6 is a plan view of the flexible printed circuit board 50 for showing the flows of the signal current and the feedback current therein, which are illustrated on the ground layer 12b provided on the first wiring layer 3 and the signal lines 9 provided on the second wiring layer 5 in the flexible printed circuit board 50. On the flexible printed circuit board 50, as indicated by arrows Q in FIG. 6, if signal currents flow through the signal lines 9, feedback currents flow through the ground layer 12b on the first wiring layer 3, as indicated by arrows R.

Alternatively, a connector for flexible printed circuit board connection has been proposed which facilitates the insertion of a flexible printed circuit board with lower degree of insertion force (see, Japanese Patent Application Publication No. 2002-50423).

The connector for flexible printed circuit board connection disclosed in the above Japanese Patent Application Publication is equipped with a board insertion section into which a flexible printed circuit board is inserted and, on the opposite side thereof, a cover insertion section into which a slide cover is inserted in such a manner that it can be retreated. Further, this connector is also equipped with a contact that applies pressure to, and releases pressure from, a flexible printed circuit board inserted into the board insertion section, respectively in response to the insertion of a slide cover and to the withdrawal thereof. With such a configuration, it becomes possible to insert a flexible printed circuit board with lower degree of insertion force in condition where it does not interfere with any operations of the slide cover.

SUMMARY OF THE INVENTION

However, in such the flexible printed circuit board electrically connected to a connector as described in FIGS. 1-6, if the flexible printed circuit board 50 is connected to the FPC connector 7, the second wiring layer 5 having signal lines 9 exists on the side of the printed circuit board 18, as shown in FIG. 5. Accordingly, the signal lines 9 on the second wiring layer 5 and a portion, indicated by N, of the ground layer 18c on the printed circuit board 18 are coupled to each other to give rise to a degree of capacitance so that the electrical impedance characteristics of the signal lines 9 can be degraded. Thus, the electrical impedance characteristics of the signal lines 9 may fall short of a predetermined value, thereby leading to deterioration in transmission characteristics of a high-frequency signal.

Further, the connector for flexible printed circuit board connection disclosed in the above Japanese Patent Application Publication is of such a configuration that a flexible printed circuit board can be inserted with small degree of insertion force and, therefore, it is difficult to improve the transmission characteristics of a high-frequency signal.

It is thus desirable to provide a flexible printed circuit board that can improve the transmission characteristics of a high-frequency signal in the vicinity of a portion thereof, which is to be connected to a connector, and an optical transmitter-receiver module and an optical transmitter-receiver, which are each equipped with such a flexible printed circuit board.

According to a first embodiment of the invention, there is provided a flexible printed circuit board for connecting an exterior connector electrically. The flexible printed circuit board has an insulation layer, a first signal wiring layer, which is provided on one side of the insulation layer, including a microstrip line, and a second signal wiring layer, which is provided on the other side of the insulation layer. The second wiring layer includes a signal connection terminal for allowing the microstrip line to connect the exterior connector electrically and a ground conductive section having a ground connection terminal for connecting the exterior connector. The ground connection terminal is arranged away from the signal connection terminal at a predetermined position connection. The microstrip line and the signal connection terminal are connected to each other by a wiring via hole that passes through the insulation layer, the first signal wiring layer, and the second signal wiring layer. The microstrip line has a taper section which gradually enlarges a width of the microstrip line toward the wiring via hole in the vicinity of the wiring via hole. The ground conductive section that corresponds to the microstrip line has a taper section with a shape matching the taper section of the microstrip line.

In the flexible printed circuit board according to a first embodiment of the present invention, a high-frequency signal current flows through the microstrip line of the first signal wiring layer and the wiring via hole that connects the microstrip line and the signal connection terminal to each other. In this case, a feedback current for the signal current flows in an opposite direction thereto, through the ground conductive section that corresponds to the microstrip line.

In this embodiment, the microstrip line has a taper section which gradually enlarges a width thereof toward the wiring via hole in the vicinity of the wiring via hole. The ground conductive section also has a taper section with a shape matching that of the taper section of the microstrip line.

For this reason, it is possible to prevent any miss matching between the microstrip line and the ground conductive section in the vicinity of the connection between the microstrip line and the wiring via hole, thereby suppressing sudden changes in characteristic impedance of the transmission lines. This allows the transmission characteristics of high-frequency signal in the vicinity of the connection between the microstrip line and the connector to be improved According to a second embodiment of the invention, there is provided an optical transmitter-receiver module having an optical transmitting-receiving circuit board, an optical transmitter module that converts an electrical signal into an optical signal and output the converted optical signal, and an optical receiver module the converts an optical signal into an electrical signal and outputs the converted electrical signal. The optical transmitter module and the optical receiver module are connected to the optical transmitting-receiving circuit board. The optical transmitting-receiving circuit board is electrically connected to a connector attached to another board by way of the above flexible printed circuit board as the first embodiment.

In the optical transmitter-receiver module according to the second embodiment of the present invention, a high-frequency signal current flows through the microstrip line of the first signal wiring layer and the wiring via hole that connects the microstrip line and the signal connection terminal to each other in the flexible printed circuit board. In this case, a feedback current for the signal current flows in an opposite direction thereto, through the ground conductive section that corresponds to the microstrip line.

In this embodiment, the microstrip line has a taper section which gradually enlarges a width thereof toward the wiring via hole in the vicinity of the wiring via hole. The ground conductive section also has a taper section with a shape matching that of the taper section of the microstrip line.

For this reason, it is possible to prevent any miss matching between the microstrip line and the ground conductive section in the vicinity of the connection between the microstrip line and the wiring via hole, thereby suppressing sudden changes in characteristic impedance of the transmission lines. This allows the transmission characteristics of high-frequency signal in the vicinity of the connection between the microstrip line and the connector to be improved, thereby enabling stable transmission and reception of data to be performed at high speed.

According to a third embodiment of the invention, there is provided an optical transmitter-receiver having the optical transmitter-receiver module as the second embodiment and a mother board to which the optical transmitter-receiver module is connected.

In the optical transmitter-receiver according to the third embodiment of the present invention, a high-frequency signal current flows through the microstrip line of the first signal wiring layer and the wiring via hole that connects the microstrip line and the signal connection terminal to each other in the flexible printed circuit board. In this case, a feedback current for the signal current flows in an opposite direction thereto, through the ground conductive section that corresponds to the microstrip line.

In this embodiment, the microstrip line has a taper section which gradually enlarges a width thereof toward the wiring via hole in the vicinity of the wiring via hole. The ground conductive section also has a taper section with a shape matching that of the taper section of the microstrip line.

For this reason, it is possible to prevent any miss matching between the microstrip line and the ground conductive section in the vicinity of the connection between the microstrip line and the wiring via hole, thereby suppressing sudden changes in characteristic impedance of the transmission lines. This allows the transmission characteristics of high-frequency signal in the vicinity of the connection between the microstrip line and the connector to be improved, thereby enabling stable transmission and reception of data to be performed at high speed.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

The following will describe preferred embodiments of a flexible printed circuit board, an optical transmitter-receiver module, and an optical transmitter-receiver in accordance with the present invention. First, a first embodiment of the flexible printed circuit board of the present invention will be described.

Figure 1:
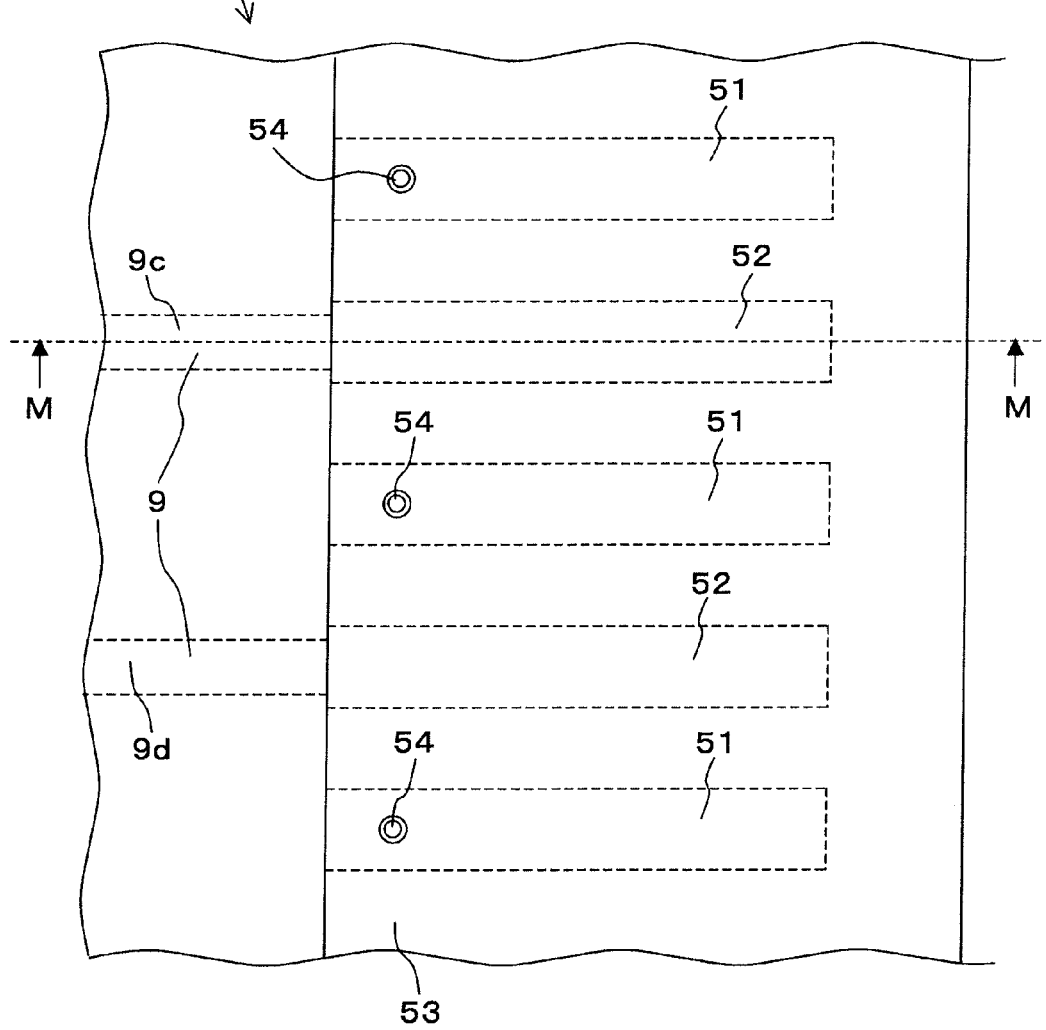
FIG. 1 is a plan view of a flexible printed circuit board as a related art.
Figure 2:
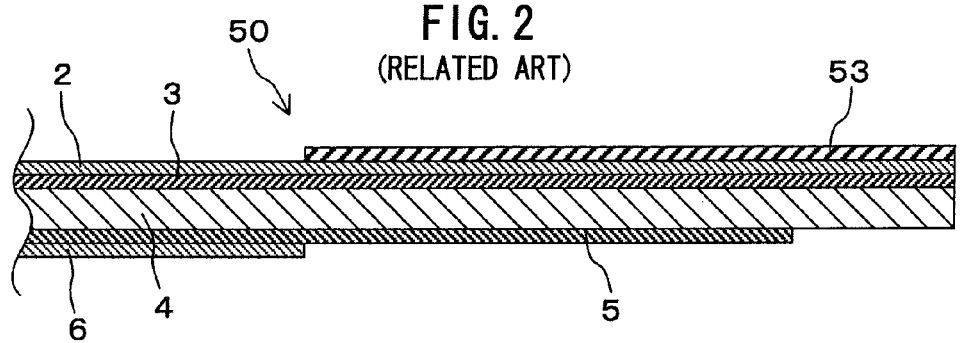
FIG. 2 is a cross-sectional view of the flexible printed circuit board as a related art taken along lines M-M of FIG. 1.
Figure 3:
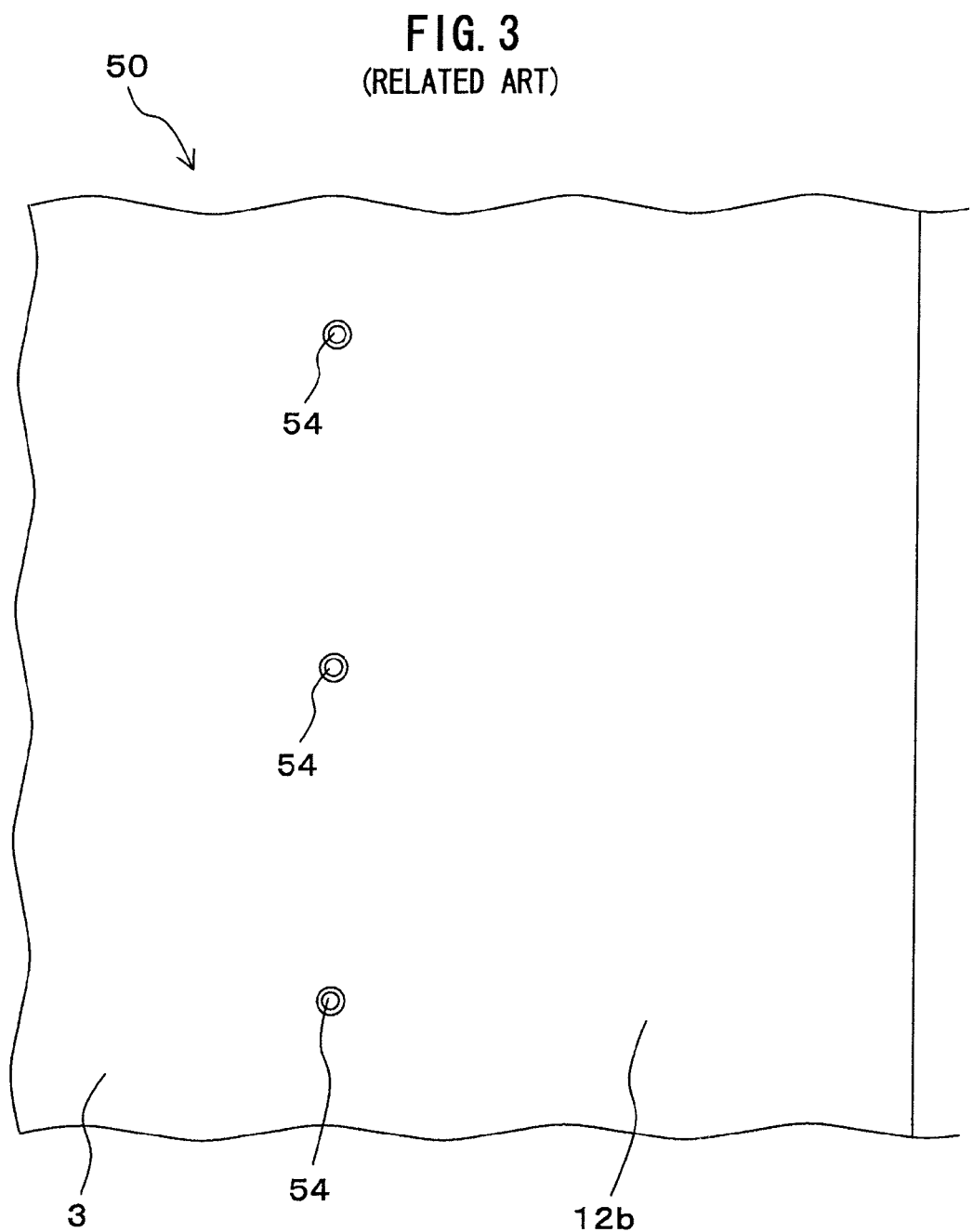
FIG. 3 is a plan view of a first wiring layer of the flexible printed circuit board as related art.
Figure 4:
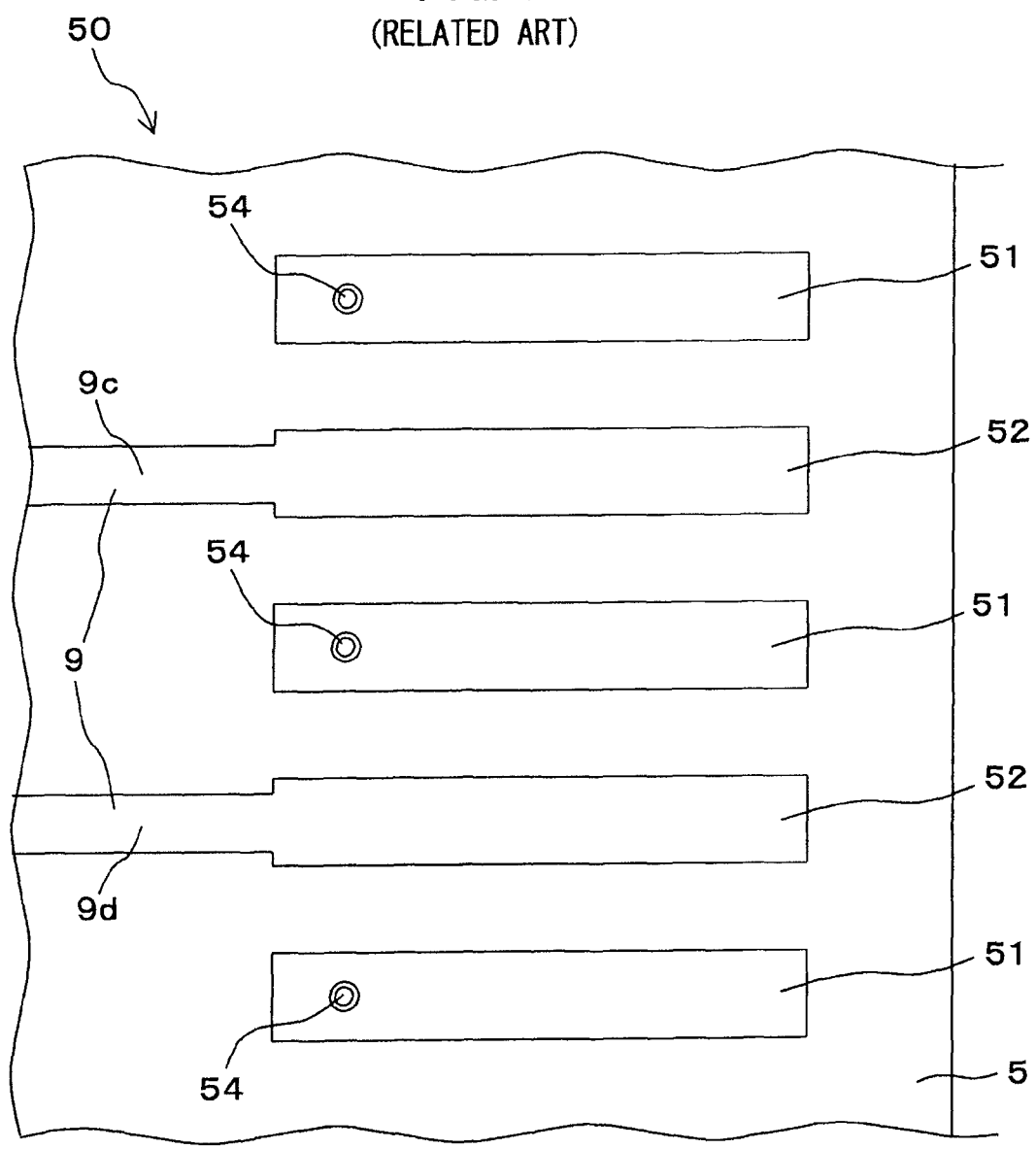
FIG. 4 is a plan view of a second wiring layer of the flexible printed circuit board as related art.
Figure 5:
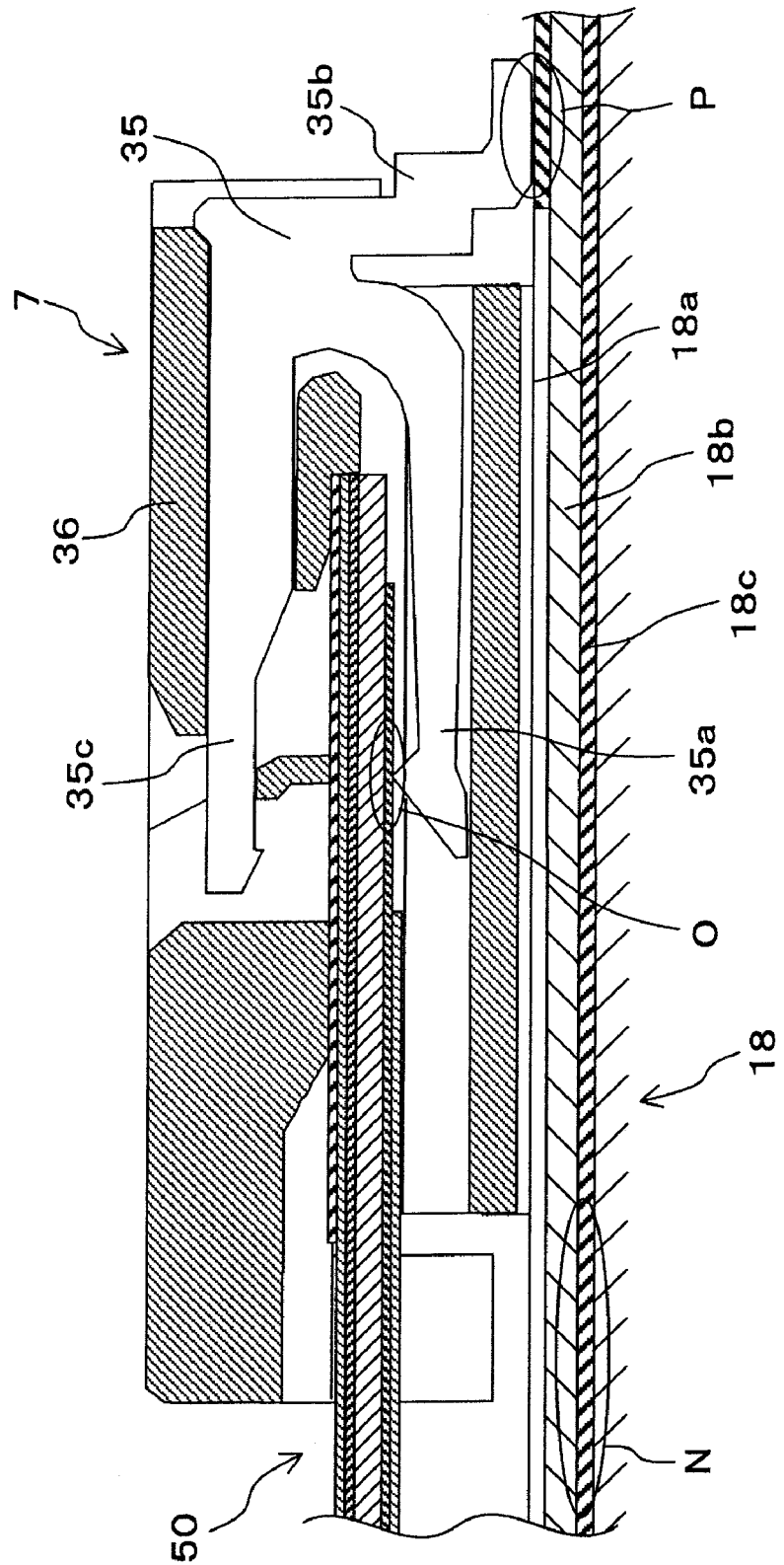
FIG. 5 is a cross-sectional view of the flexible printed circuit board as related art, a printed circuit board, and a flexible printed circuit (FPC) connector mounted on the printed circuit board for illustrating a condition where the flexible printed circuit board is connected to the connector.
Figure 6:
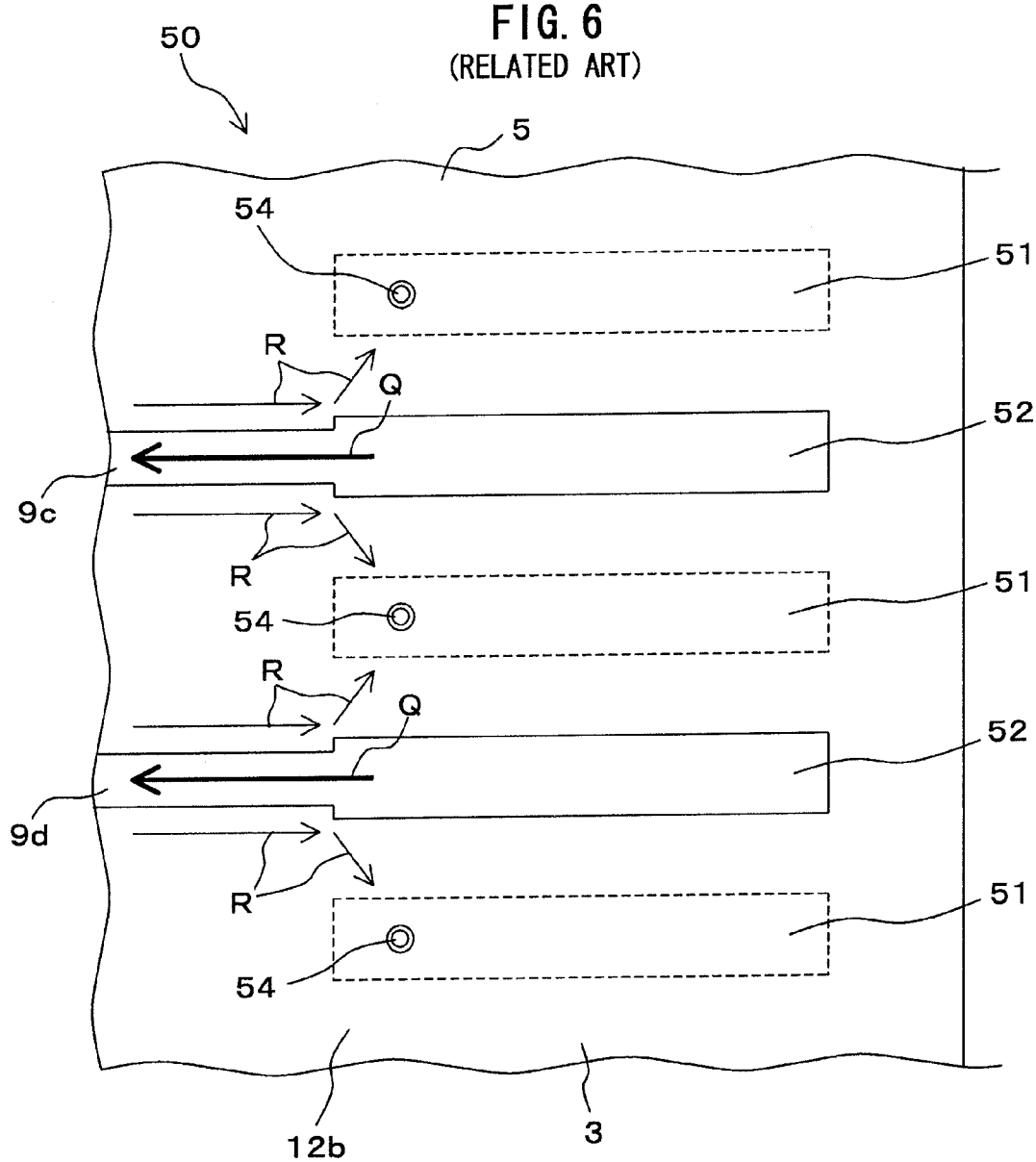
FIG. 6 is a plan view of the flexible printed circuit board as related art for showing the flows of the signal current and the feedback current therein.
Figure 7:
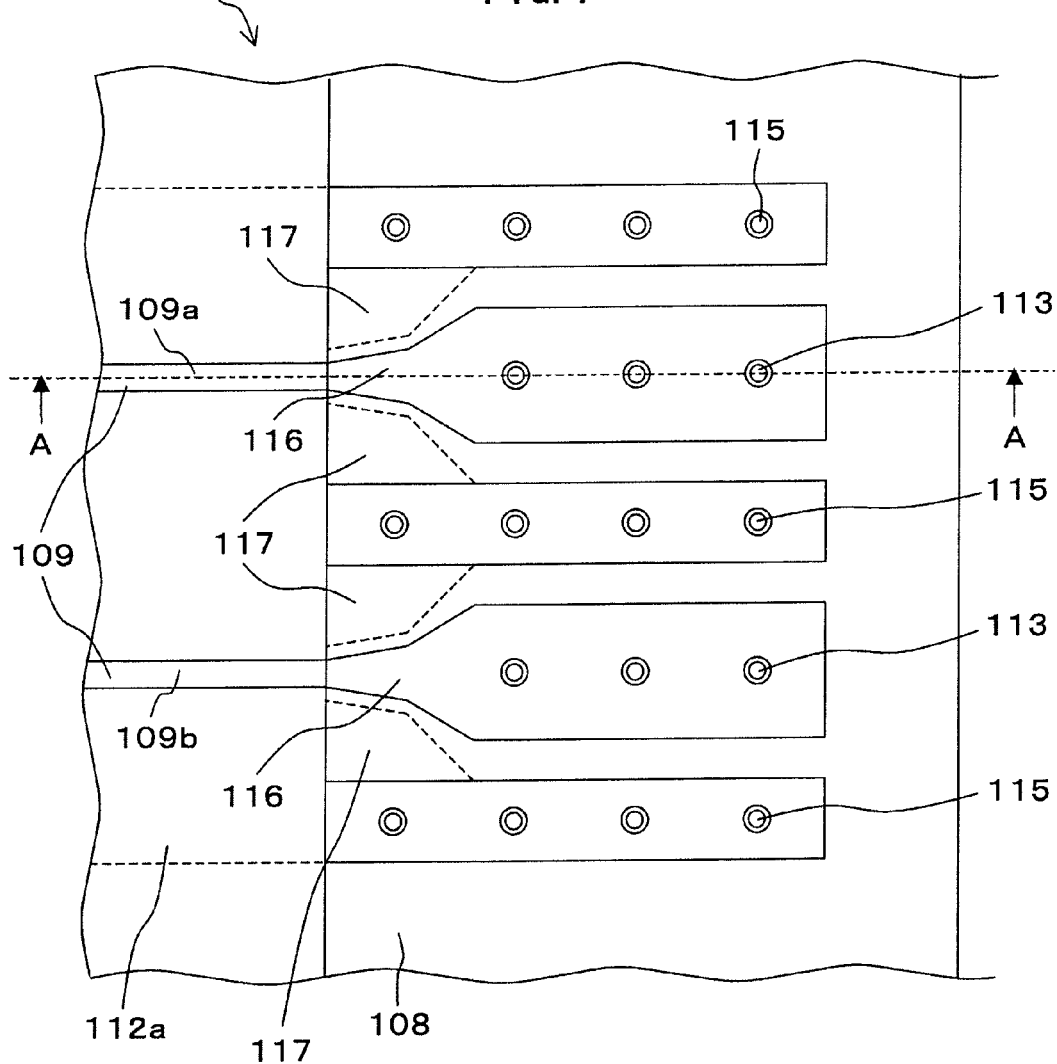
FIG. 7 is a plan view of a flexible printed circuit board according to a first embodiment of the present embodiment.
Figure 8:
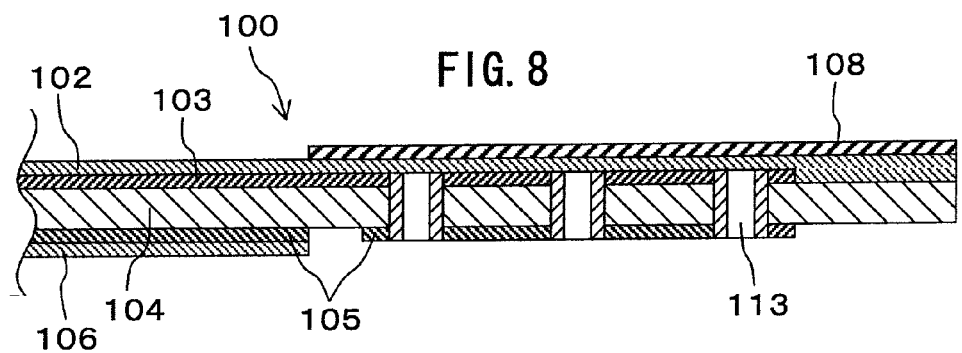
FIG. 8 is a cross-sectional view of the flexible printed circuit board according to the first embodiment of the present invention taken along lines A-A of FIG. 7.
Figure 9:
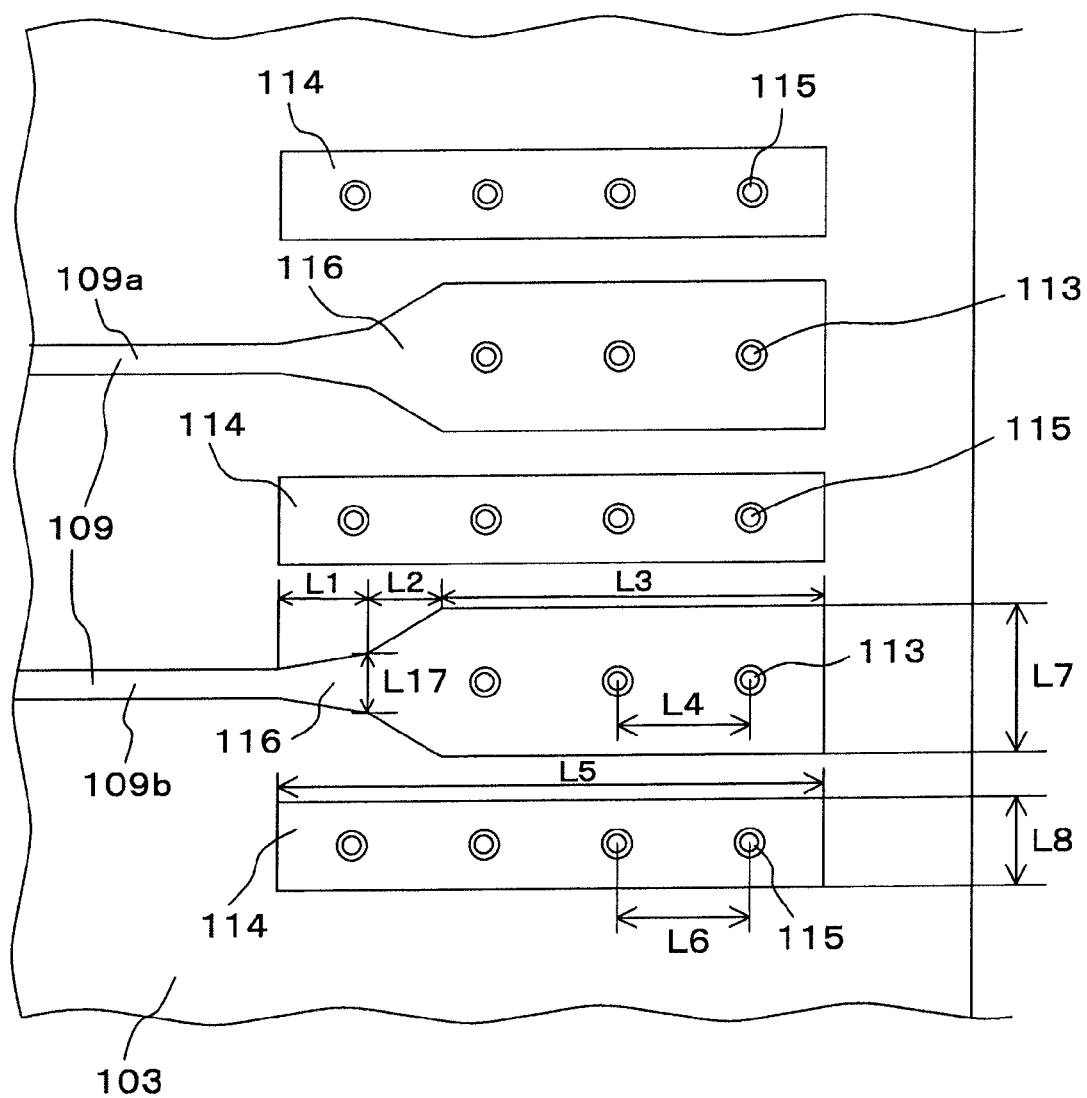
FIG. 9 is a plan view of a first wiring layer of the flexible printed circuit board according to the first embodiment of the present invention.
Figure 10:
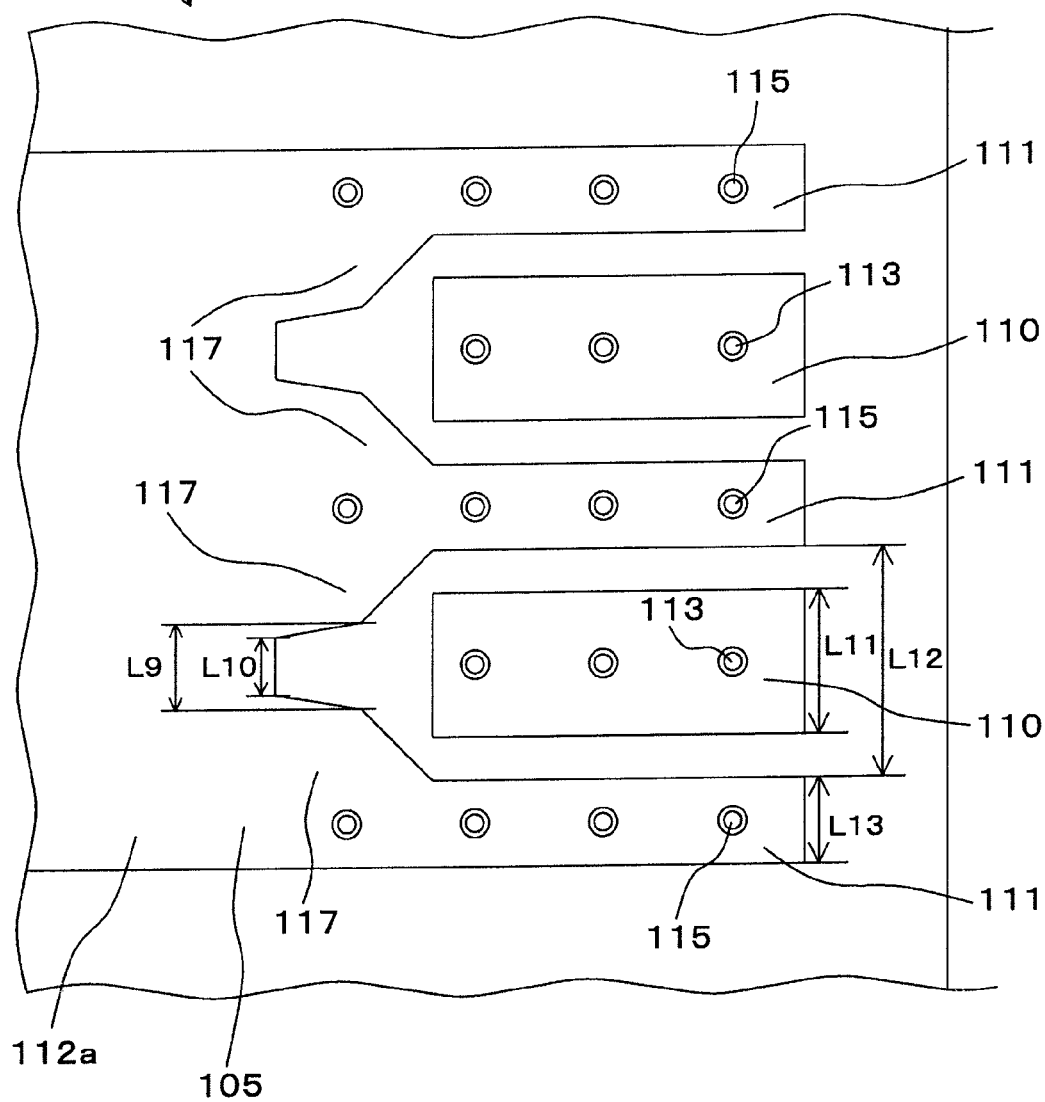
FIG. 10 is a plan view of a second wiring layer of the flexible printed circuit board according to the first embodiment of the present invention.
Figure 11:
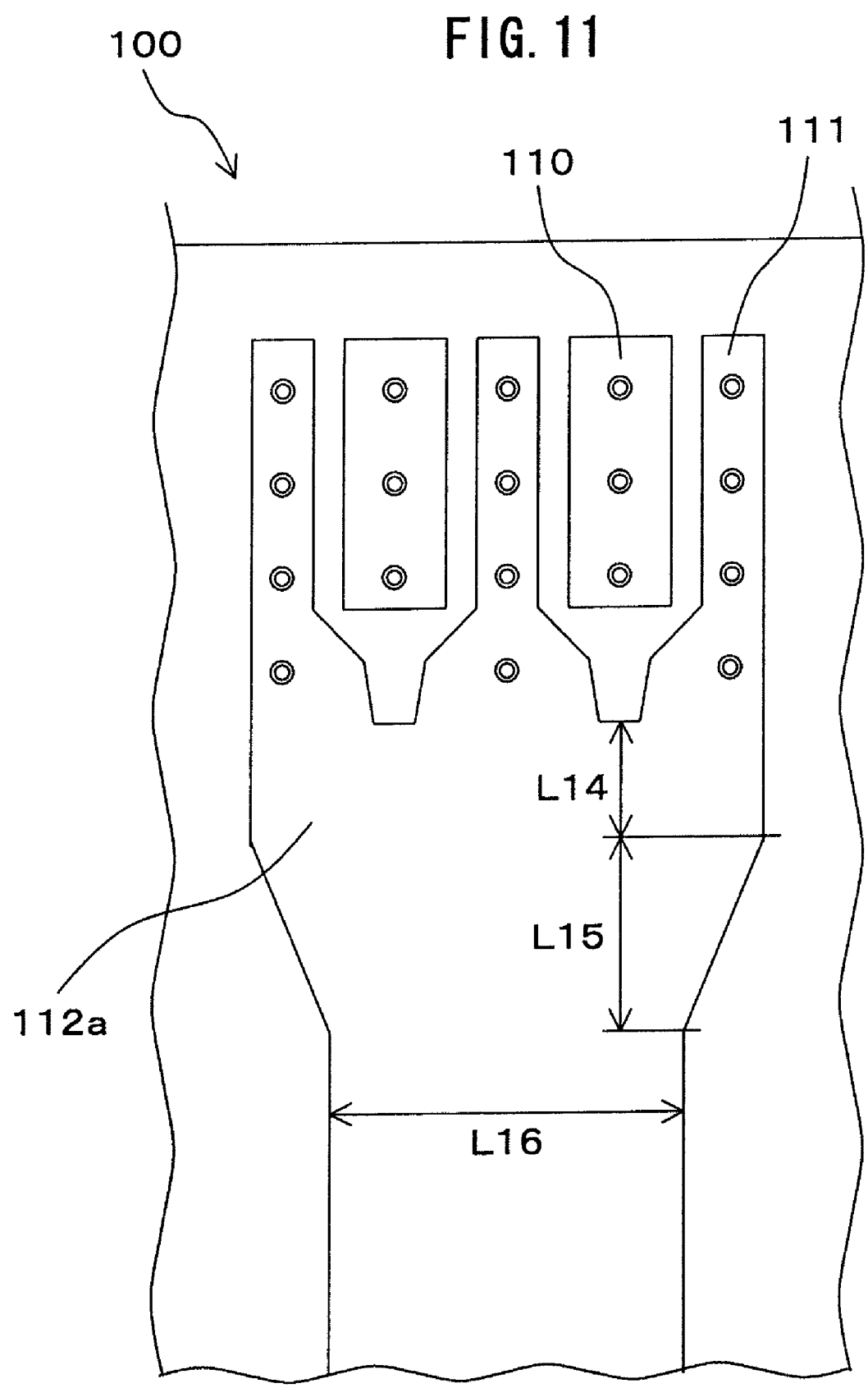
FIG. 11 is another plan view of the second wiring layer of the flexible printed circuit board according to the first embodiment of the present invention.

Configuration of the Flexible Printed Circuit Board According to the First Embodiment of the Present Embodiment FIGS. 7-11 are explanatory views of a configuration of a flexible printed circuit board 100 according to a first embodiment of the present invention. FIG. 7 is a plan view of the flexible printed circuit board 100 for showing an outline thereof, a part of which configuration is indicated, in a transparent condition, by a broken line for purposes of clarification. FIG. 8 is a cross-sectional view of the flexible printed circuit board 100 according to the first embodiment of the present invention taken along lines A-A of FIG. 7. FIG. 9 is a plan view of a first wiring layer 103, which will be described later, of the flexible printed circuit board 100 according to the first embodiment of the present invention, as viewed from an upper side in FIG. 8. FIGS. 10 and 11 are plan views of a second wiring layer 105 of the flexible printed circuit board 100 according to the first embodiment of the present invention, as viewed from a lower side in FIG. 8. FIG. 10 illustrates portions that correspond to those of FIGS. 7 and 9. FIG. 11 is a horizontal elongation of FIG. 10.

Figure 12:
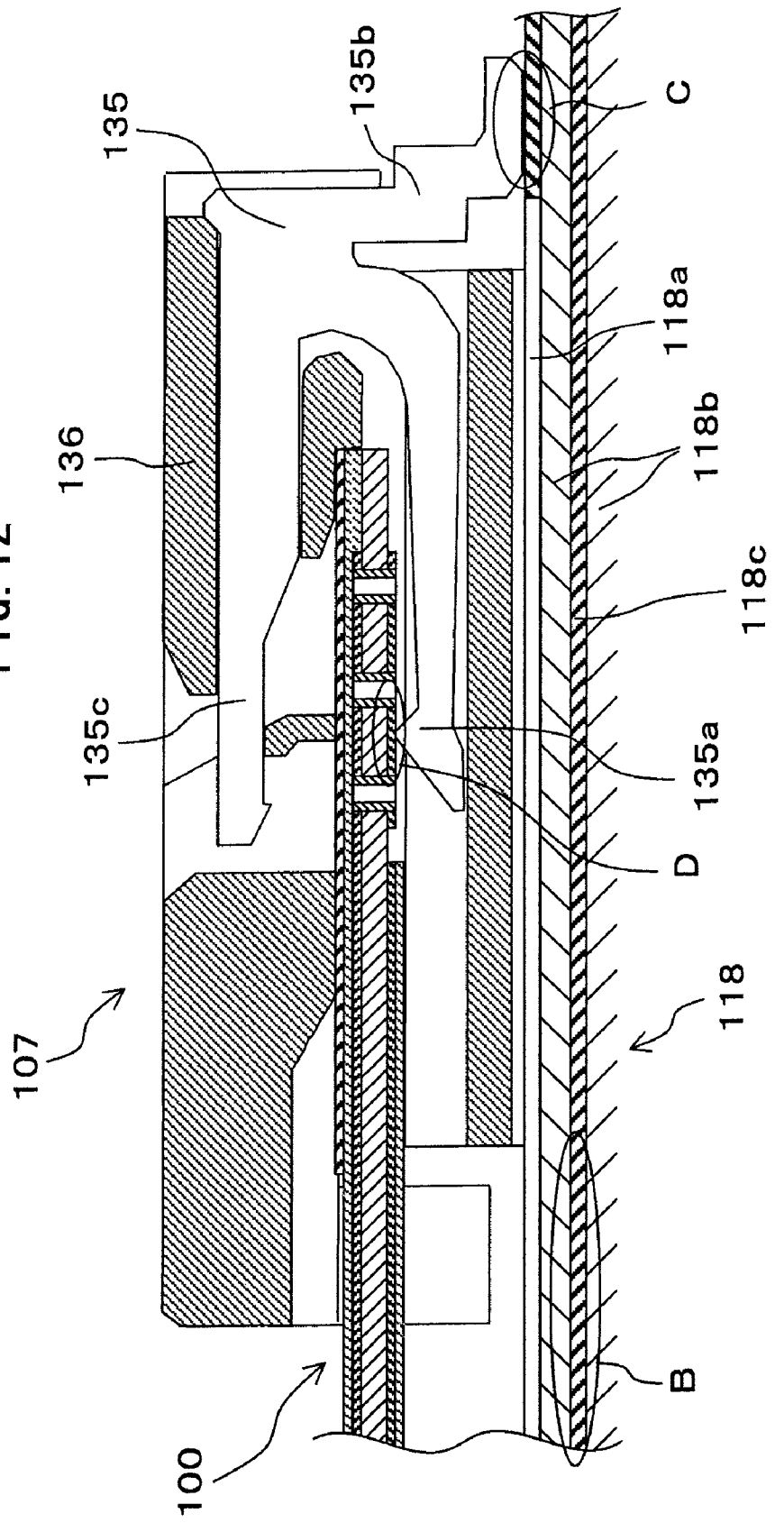
FIG. 12 is a cross-sectional view of the flexible printed circuit board according to the first embodiment of the present invention, a printed circuit board, and a flexible printed circuit (FPC) connector mounted on the printed circuit board for illustrating a condition where the flexible printed circuit board is connected to the connector.

FIG. 12 is a cross-sectional view of the flexible printed circuit board 100 according to the first embodiment of the present invention, a printed circuit board 118, and a flexible printed circuit (FPC) connector 107 mounted on the printed circuit board 118 for illustrating a condition where the flexible printed circuit board 100 is connected to the FPC connector 107. It is to be noted that the flexible printed circuit board 100 in FIG. 12 is illustrated as one shown in FIG. 7 with it being taken along the lines A-A of FIG. 7 and the printed circuit board 118 is shown only partially.

As shown in FIGS. 7-11, the flexible printed circuit board 100 is formed by alternately laminating vertically the first, second and third insulation layers 102, 104, 106 and the first and second wiring layers 103, 105. The first and second wiring layers 103, 105 are made of a metal film such as a copper clad laminate (CCL). The first, second and third insulation layers 102, 104, 106 are made of an epoxy-based, or a polyimide-based, resin. The first insulation layer 102 and the third insulation layer 106 are made of, for example, a cover lay as a protection film. In a predetermined region of an end of the flexible printed circuit board 100, for purposes of making electrical connection with the FPC connector 107, the third insulation layer 106 is in an unformed state. On an upper surface of the first insulation layer 102, a cover plate 108 is provided to prevent any damage from occurring at times of making connection with the FPC connector 107.

As shown in FIGS. 7 and 9, on the first wiring layer 103, signal lines 109a and 109b are formed as microstrip lines. At an end section of the second wiring layer 105 are formed a signal connection pad 110 for electrical connection between the FPC connector 107 and the signal lines 109, and a ground connection pad 111 for connection between the FPC connector 107 and therein an additional plan view of a flow of a signal current and a feedback current at a time. Further, as shown in FIGS. 7, 10, and 11, on the second wiring layer 105, a ground layer 112a is formed. As indicated by L16 in FIG. 11, the ground layer 112a is formed so as to have a predetermined width at a position thereof that corresponds to the signal lines 109a and 109b. The width of the ground layer 112a, indicated by L16, is determined by taking into account any influence on the surroundings by the resonance of the ground layer 112a.

The signal lines 109 on the first wiring layer 103 and the signal connection pads 110 on the second wiring layer 105 are connected to each other by signal via holes 113 which passes through the first wiring layer 103, the second insulation layer 104, and the second wiring layer 105. For purposes of reducing a difference in potential between the signal lines 109 and the signal connection pads 110, they are connected to each other by, for example, the three signal via holes 113.

Further, as illustrated in FIG. 9, in order to avoid intrusion of noise from the outside and interference between the signal lines, ground guard sections 114 are respectively formed at portions corresponding to positions of the ground connection pads 111. To form the ground guard section 114, at portions that correspond to the ground connection pads 111, the first wiring layer 103 and the ground layer 112a on the second wiring layer 105 are connected to each other by ground via holes 115. To reduce the difference in potential between the ground guard section 114 in the first wiring layer 103 and the second wiring layer 105, the two are connected to each other by the ground via holes 115, for example, of three or more.

As illustrated in FIGS. 7 and 9, each of the signal lines 109a and 109b has a signal line taper section 116 which enlarges gradually its width toward the signal via hole 113 in the vicinity of the signal via hole 113. Further, as shown in FIGS. 7 and 10, the ground layer 112a on the second wiring layer 105 has ground layer taper sections 117, a shape of each of which meets that of the signal line taper section 116 of each of the signal lines 109a and 109b.

As shown in FIG. 12, the FPC connector 107 is mounted on a printed circuit board 118, which includes a signal wiring layer 118a, an insulation layer 118b, and a ground layer 118c, and is connected to the flexible printed circuit board 100. The FPC connector 107 includes a resin-made housing 136 and a predetermined number of metal-made contacts 135 within the housing 136, each contact being constituted of an FPC connection section 135a that comes into contact with the connection pads of the flexible printed circuit board 100, a support section 135c for supporting the housing 136, and a lead section 135b to be connected to the printed circuit board 118. The metal-made contacts 135 are arranged in parallel to each other with predetermined spacing therebetween. Spacing between the connection pads of the flexible printed circuit board 100 corresponds to spacing between the contacts 135.

The contacts 135 of the FPC connector 107 are respectively soldered to connection pads, not shown, which are formed on the outermost signal wiring layer 118a of the printed circuit board 118 at a position on the lead section 135b indicated by C. The connection pads of the printed circuit board 118 are respectively connected to a signal line or to a ground pattern, neither of which is shown. The signal line or the ground pattern is formed on the signal wiring layer 118a of the printed circuit board 118.

The FPC connector 107 shown in FIG. 12 is of a so-called lower contact type, so that the flexible printed circuit board 100 is thus connected to the FPC connector 107 in a condition where the connection pads are positioned toward a lower surface thereof, as indicated by D.

The flexible printed circuit board 100 of the present embodiment shown in FIGS. 7-12 may be configured so that a single end mode signal may be transmitted through a single signal line 109, or a differential signal may be transmitted through a pair of signal lines 109.

Operations of the Flexible Printed Circuit Board According to the First Embodiment of the Present Invention Next, the following will describe an example of the operations of the flexible printed circuit board 100 according to the first embodiment of the present invention. In the flexible printed circuit board 100 of the present embodiment, a signal is transmitted through the signal lines 109a and 109b and the signal via holes 113. When the flexible printed circuit board 100 of the present embodiment is connected to the lower contact type FPC connector 107 as shown in FIG. 12, the first wiring layer 103 including the signal lines 9 is positioned at the opposite side of the printed circuit board 118 on which the FPC connector 107 is mounted. Accordingly, the signal lines 9 are coupled mainly with the ground layer 112a provided on the second wiring layer 105 of the flexible printed circuit board 100, so that the signal lines 109 are not coupled with the ground layer 118c of the printed circuit board 118 indicated by B. This prevents electrical impedance characteristics of the signal lines 109 because of capacitance occurred as a result of coupling between the signal lines 109 and the ground layer 118c of the printed circuit board 118 from deteriorating. This also prevents any transmission characteristics of a high-frequency signal from deteriorating.

Figure 13:
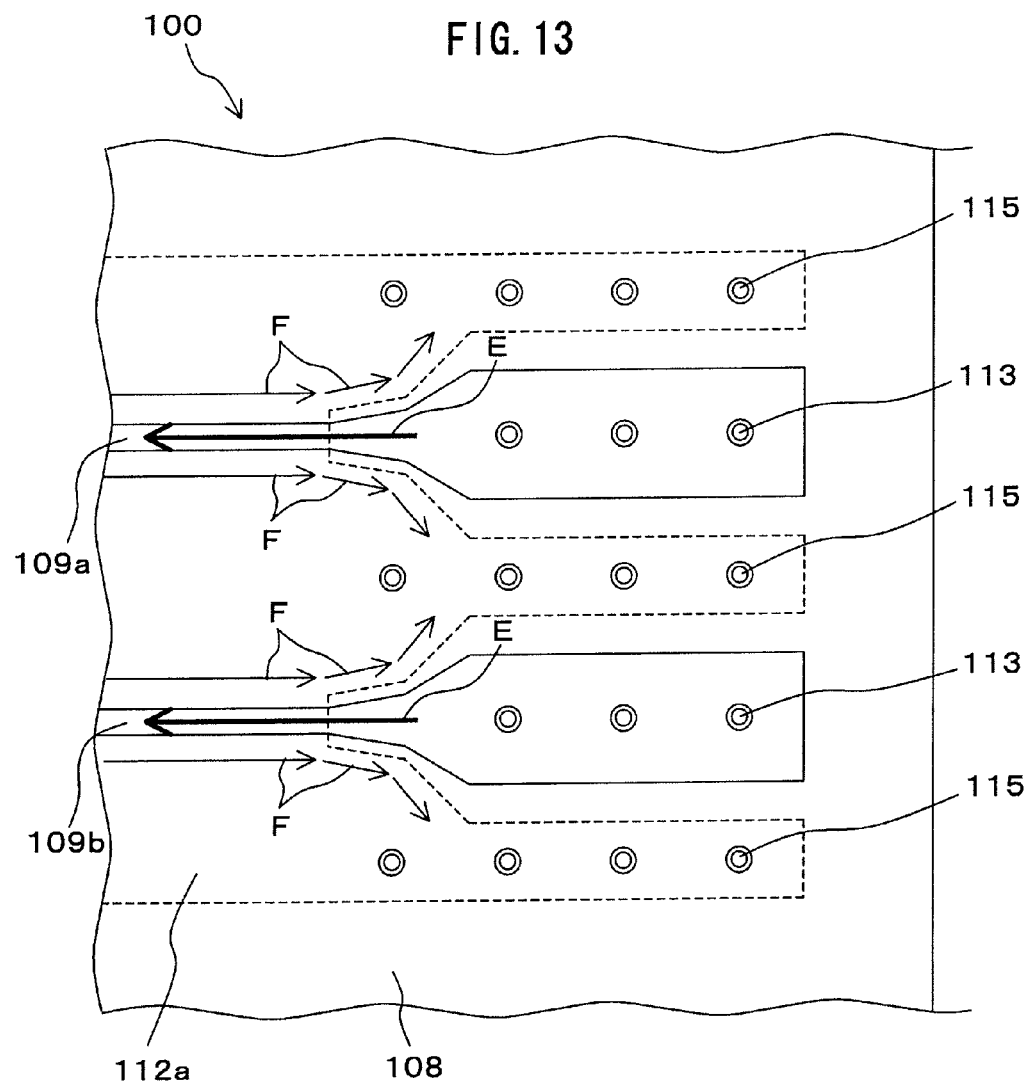
FIG. 13 is a plan view of the flexible printed circuit board according to the first embodiment of the present invention for showing the flows of the signal current and the feedback current therein.

FIG. 13 is a plan view of the flexible printed circuit board 100 according to the first embodiment of the present invention for showing the flows of a signal current and a feedback current when a high-frequency signal is being transmitted through the signal line. FIG. 13 shows the signal lines 109a and 109b formed on the first wiring layer 103, and the ground layer 112a formed on the second wiring layer 105 on the flexible printed circuit board 100. When the high-frequency signal is transmitted through the signal lines 109 on the flexible printed circuit board 100, currents flow through the signal lines 109a and 109b, as indicated by arrows E in FIG. 13. At the same time, feedback currents flow through the ground layer 112a, as indicated by arrows F in FIG. 13.

In the flexible printed circuit board 100 according to the first embodiment of the present invention, each of the signal lines 109a and 109b provided on the first wiring layer 103a has a signal line taper section 116 which enlarges gradually a width of the signal line toward the signal via hole 113 in the vicinity of the signal via hole 113. Further, the ground layer 112a has ground layer taper sections 117 in the vicinity of the ground connection pads 111 on the second wiring layer 5 so that a shape of each of ground layer taper sections 117 can meet that of each of the taper sections 116 of the signal lines 109a and 109b.

Accordingly, in the vicinity of a connection between the signal lines 109a and 109b and the signal via holes 113, it is possible to reinforce coupling between the signal lines 109a and 109b and the ground layer 112a on the second wiring layer 105, thereby inhibiting sudden changes in the electrical impedance characteristics of the transmission line. Furthermore, as indicated by arrows F in FIG. 13, in the vicinity of bottom of each of the ground connection pads 111, it is possible to suppress sudden changes in the routing of a feedback current. Thus, in places where the flexible printed circuit board 100 and the FPC connector 107 are connected to each other, it is possible to improve transmission characteristics of a high-frequency signal.

Figure 14:
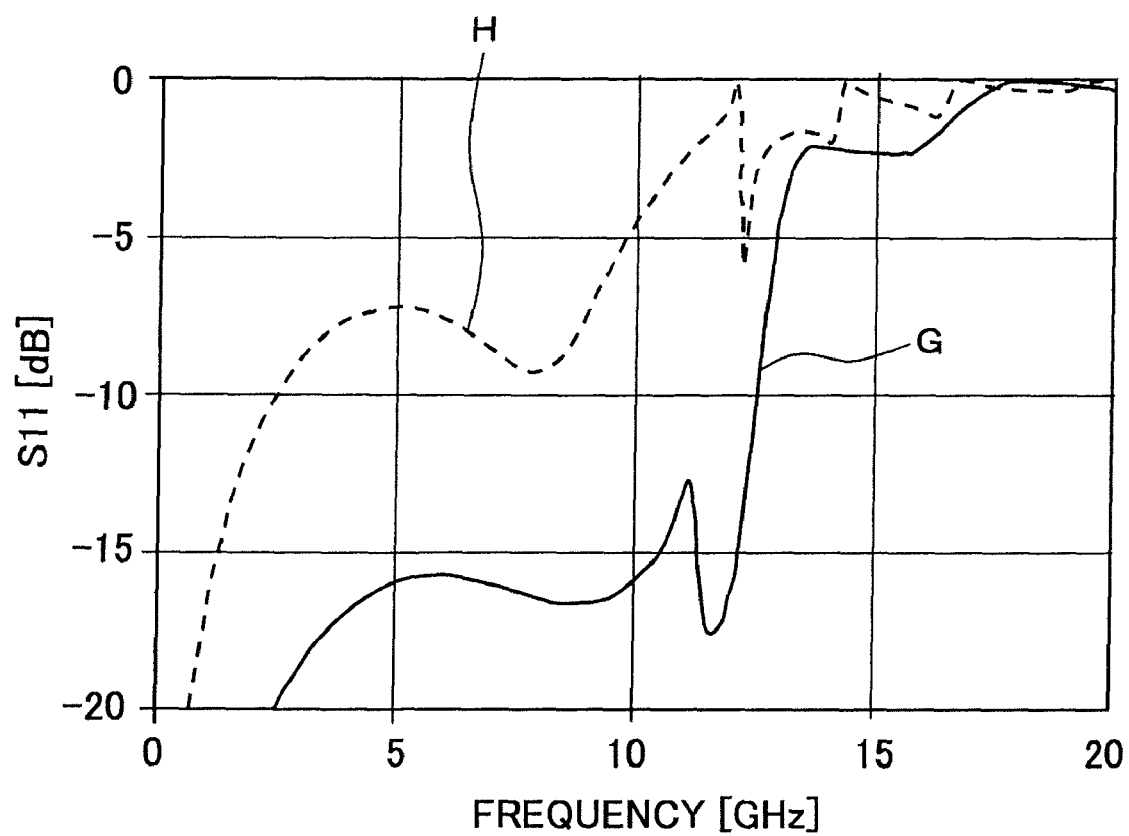
FIG. 14 is a graph for illustrating the results of measurement of reflection loss.

FIG. 14 shows the results of measuring a reflection loss (S11) of signal currents through the signal lines 9 at various frequencies between the flexible printed circuit board 50 as related art, which is illustrated in FIGS. 1-5 and the flexible printed circuit board 100 according to the first embodiment of the present invention, which is illustrated in FIGS. 7-12. In FIG. 14, G indicates the results of measurement of the flexible printed circuit board 100 and H indicates the results of measurement of the flexible printed circuit board 50.

Figure 15:
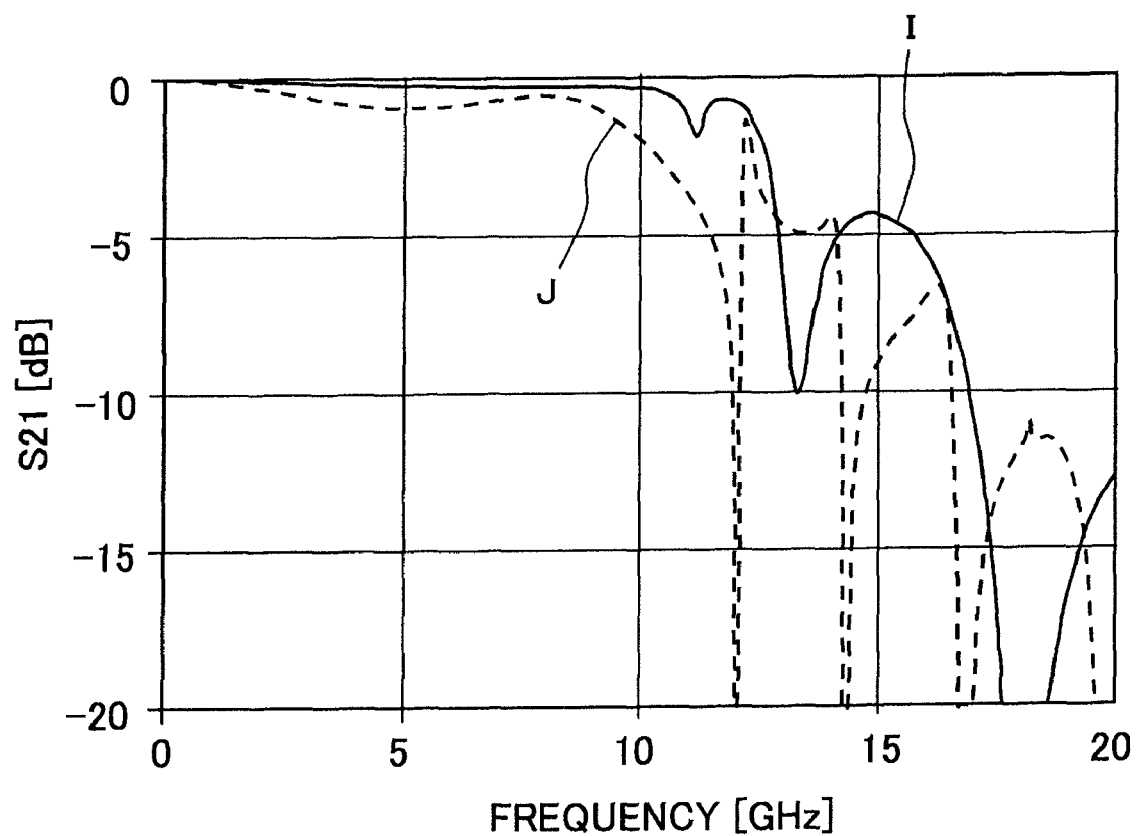
FIG. 15 is a graph for illustrating the results of measurement of transmission loss.

FIG. 15 shows the results of measuring a transmission loss (S21) of signal currents through the signal lines 9 at various frequencies between the flexible printed circuit board 50 as related art, which is illustrated in FIGS. 1-5 and the flexible printed circuit board 100 according to the first embodiment of the present invention, which is illustrated in FIGS. 7-12. In FIG. 15, I indicates the results of measurement of the flexible printed circuit board 100 and J indicates the results of measurement of the flexible printed circuit board 50.

Measurements of various items incorporated into the measurement results are as follows. In the flexible printed circuit board 100 of the present embodiment, the diameters of the signal via hole 113 and the ground via hole 115 are 0.25 mm, respectively. Space between the signal via holes 113 or the ground via holes 115 indicated by L4 in FIG. 9 is 0.725 mm. Further, a width represented by L7 is 0.95 mm and a width represented by L8 is 0.65 mm. Further, the lengths represented by L1 and L2 are 0.5 mm, respectively. A length represented by L3 is 2.0 mm. A width represented by L17 is 0.25 mm. A length represented by L5 is 3.0 mm.

Further, in the flexible printed circuit board 100 of the present embodiment, a width of the signal connection pad 110 represented by L11 in FIG. 10 is 0.95 mm and a width of the ground connection pad 111 represented by L13 is 0.65 mm. Furthermore, a distance represented by L9 is 0.35 mm. A distance represented by L10 is 0.1025 mm. A distance represented by L12 is 1.35 mm. Further, in FIG. 11, a length represented by L14 is 1.5 mm. A length represented by L15 is 2.0 mm. A width represented by L16 is 2.5 mm.

Further, in the flexible printed circuit board 100 of the present embodiment, the second insulation layer 104 is made of a polyimide-based resin and has a dielectric constant value of 3.2 and a tan δ value of 0.005. Further, the flexible printed circuit board 100 has a thickness of 0.05 mm and is controlled so as to have an electrical impedance characteristic value of 50Ω.

To transmit a high-speed signal stably, it is demanded that at a frequency of a transmission data rate, a transmission channel have a reflection loss (S11) of −10 dB or less and a transmission loss (S21) of −3 dB or more. As shown in FIGS. 14 and 15, in the flexible printed circuit board 100 of the present embodiment, at a frequency of 10 GHz, its reflection loss is −16 dB or less and its transmission loss is −0.3 dB or more. Therefore, in the flexible printed circuit board 100 of the present embodiment, a high speed serial transmission of 10 Gbps can be carried out stably. From the above, it can be confirmed that in the flexible printed circuit board 100 of the present embodiment, the transmission characteristics of a high-frequency signal can be enhanced in the vicinity of the connection portion of the flexible printed circuit board 100 that is connected with the FPC connector 7.

The following will describe an optical transmitter-receiver module and a network card as an optical transmitter-receiver module and an optical transmitter-receiver according to second and third embodiments of the present invention. It is to be noted that in the optical transmitter-receiver module and the network card, the flexible printed circuit board 100 of the first embodiment thereof is used.

Figure 16:
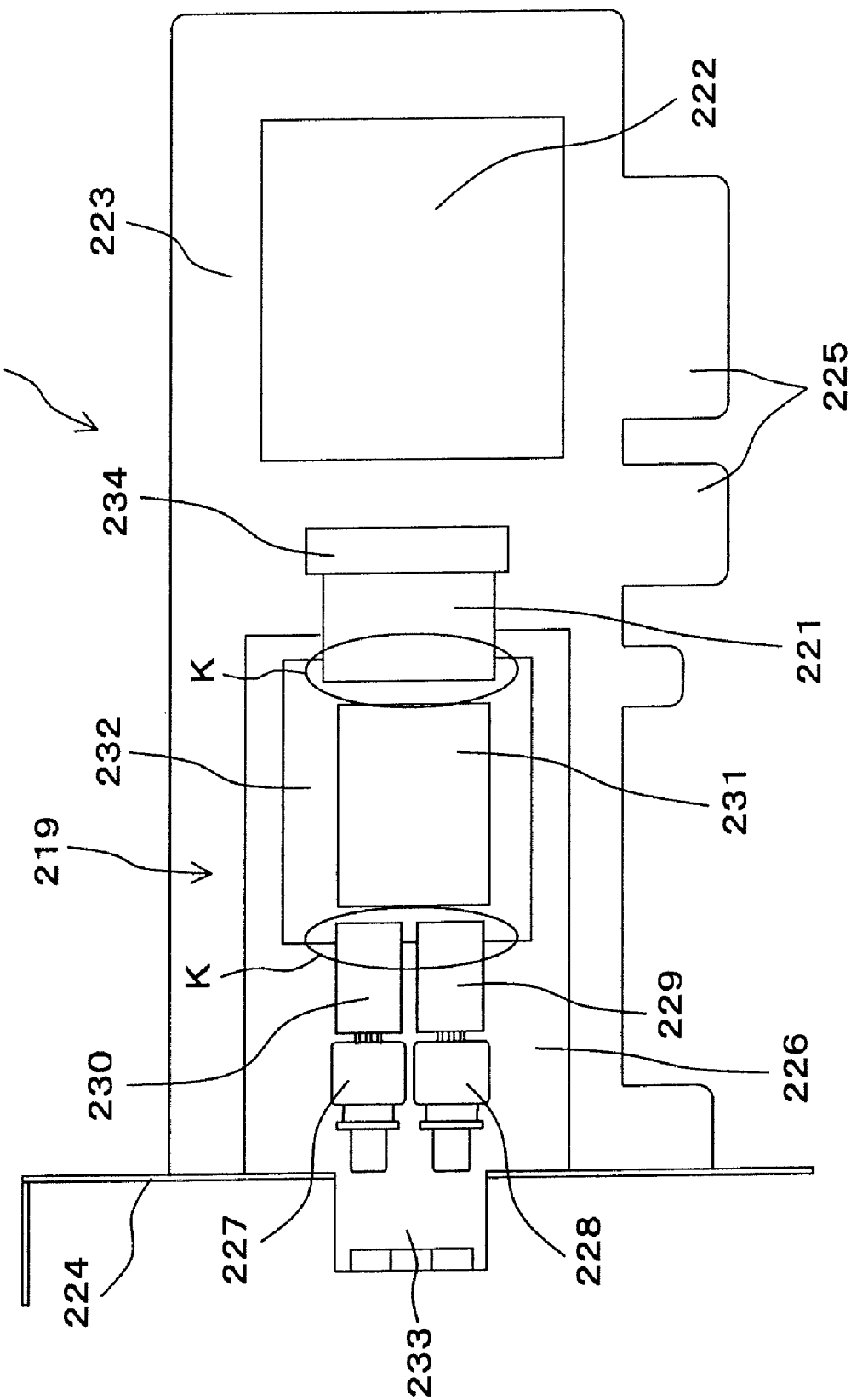
FIG. 16 is a plan view of an optical transmitter-receiver module and a network card as a first example of second and third embodiments of the present invention.
Figure 17:
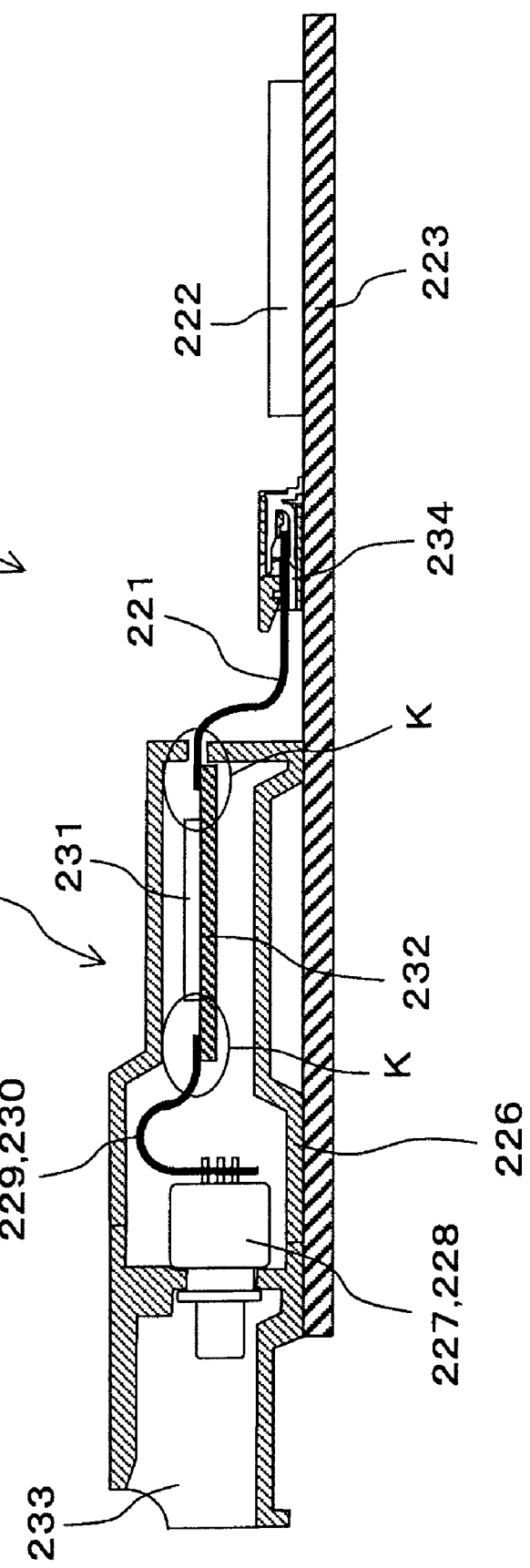
FIG. 17 is a cross-sectional view of the optical transmitter-receiver module and the network card as the first example of the second and third embodiments of the present invention.
Figure 18:
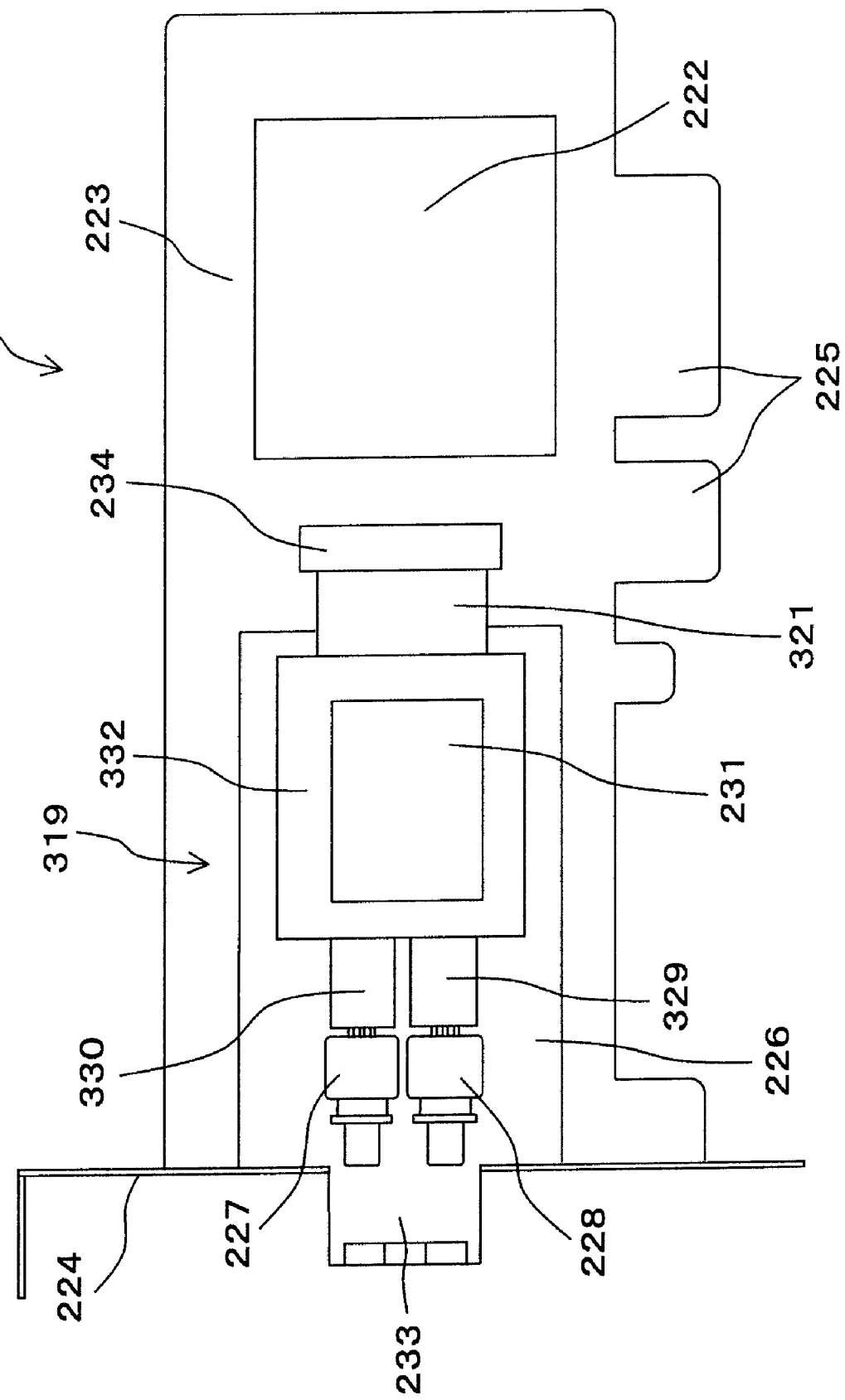
FIG. 18 is a plan view of an optical transmitter-receiver module and a network card as a second example of the second and third embodiments of the present invention.
Figure 19:
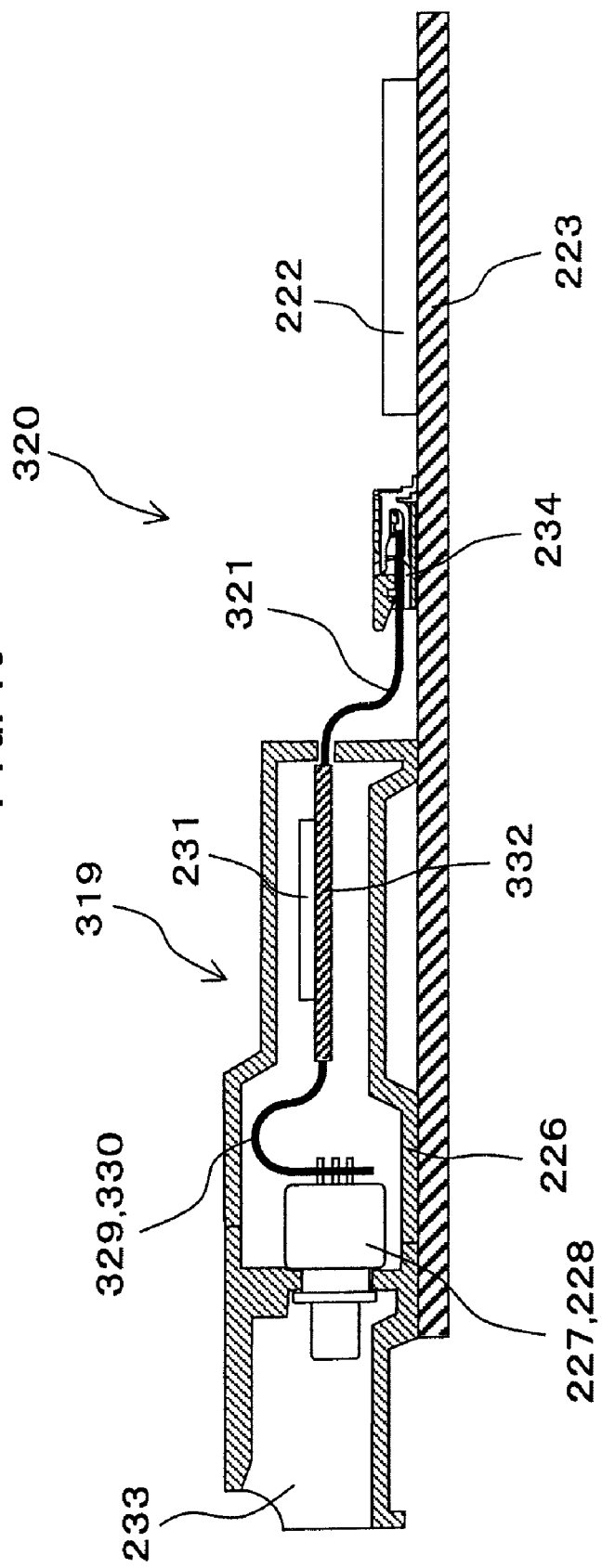
FIG. 19 is a cross-sectional view of the optical transmitter-receiver module and the network card as the second example of the second and third embodiments of the present invention.

Configuration Example of Optical Transmitter-Receiver Module and Network Card of the Second and Third Embodiments FIGS. 16-19 are explanatory diagrams each for illustrating a configuration of an optical transmitter-receiver module 219 and a network card 220 according to the second and third embodiments of the present invention. FIG. 16 is a plan view of an optical transmitter-receiver module 219 and a network card 220 as a first example of second and third embodiments of the present invention and FIG. 17 is a cross-sectional view of the optical transmitter-receiver module 219 and the network card 220 for showing an outline thereof. FIG. 18 is a plan view of an optical transmitter-receiver module 319 and a network card 320 as a second example of the second and third embodiments of the present invention and FIG. 19 is a cross-sectional view of the optical transmitter-receiver module 312 and the network card 320 for showing an outline thereof. In FIG. 17-19, a bezel 224, which will be described later, is not shown.

The network cards 220, 320 of the third embodiment of the invention include the optical transmitter-receiver modules 219, 319, respectively, as the second embodiment of the invention. The network cards 220, 320 are respectively inserted into an expansion slot in an item of equipment such as a personal computer, to enable transmission of data to, or receipt of data from an item of equipment such as an external information communication device, to be implemented by way of an optical cable connected to optical cable connection connector 233 that will be described later.

The following will describe configurations of the optical transmitter-receiver modules 219, 319 and the network cards 220, 320.

As shown in FIGS. 16 and 17, the network card 220 includes the optical transmitter-receiver module 219 having the optical cable connection connector 233, an optical transmitting-receiving board connection FPC 221, a host board 223 having an optical transmitting-receiving circuit section 222, and a bezel 224 attached to an end section of the host board 223. The optical transmitter-receiver module 219 is mounted on the host board 223 so that the optical cable connection connector 233 can protrude from the bezel 224. Further, the host board 223 has card edge sections 225. The network card 220 is mounted on an item such as a personal computer by inserting the card edge sections 225 into an expansion slot thereof.

The optical transmitter-receiver module 219 has an optical transmitter-receiver module cabinet 226, a Transmitter Optical Sub-Assembly (TOSA) 227, a Receiver Optical Sub-Assembly (ROSA) 228, a TOSA connection FPC 230, a ROSA connection FPC 229, and an optical transmitting-receiving board 232 having an optical transmitting-receiving circuit section 231.

The TOSA 227 and the ROSA 228 are arranged side by side at a position that corresponds to the optical cable connection connector 233 on the optical transmitter-receiver module cabinet 226. The TOSA 227 is a transmission optical device equipped with a laser diode etc. and has an interface for a connector of an optical cable connected to the optical cable connection connector 233, so as to convert an electrical signal into an optical signal and output it. The TOSA 227 is one example of an optical transmitter module. The ROSA 228 is a reception optical device equipped with a photodiode and the like and has an interface for the connector of the optical cable connected to the optical cable connection connector 233, so as to convert an optical signal into an electrical signal and output it. The ROSA 228 is one example of an optical receiver module.

The TOSA 227 and the ROSA 228 are connected to the optical transmitting-receiving board 232 by means of respectively the TOSA connection FPC 230 and the ROSA connection FPC 229. The optical transmitting-receiving board 232 is a rigid board and has the optical transmitting-receiving circuit section 231 connected to the TOSA 227 and the ROSA 228 through the TOSA connection FPC 230 and the ROSA connection FPC 229, respectively. The optical transmitting-receiving circuit section 231 includes a drive circuit for the laser diode in the TOSA 227, a post-amplifier circuit for an optical signal received by the photodiode in the ROSA 228.

The optical transmitting-receiving board 232 is connected to the host board 223 by way of an optical transmitting-receiving board connection FPC 221. Thus, circuits of the optical transmitting-receiving circuit section 231 are connected to circuits of an optical transmitting-receiving circuit section 222 by way of the optical transmitting-receiving board connection FPC 221. The optical transmitting-receiving circuit section 222 is equipped with items such as, for example, a physical layer (PHY) chip and a media access control (MAC) chip. The optical transmitting-receiving board 232 is one example of an optical transmitting-receiving circuit board and the host board 223 is one example of a mother board. The flexible printed circuit board 100 of the first embodiment illustrated in FIGS. 7-12 is applied to the optical transmitting-receiving board connection FPC 221.

In the optical transmitter-receiver module 219, the TOSA connection FPC 230, the ROSA connection FPC 229, the optical transmitting-receiving board connection FPC 221, and the optical transmitting-receiving board 232 are soldered to connection portions of the boards indicated by K in FIGS. 16 and 17. Accordingly, in contrast to circumstances where the TOSA connection FPC 230, the ROSA connection FPC 229, the optical transmitting-receiving board connection FPC 221, and the optical transmitting-receiving board 232 are integrally manufactured into a flex-rigid board, these FPC and board can be manufactured separately from each other. It is thus possible to manufacture these FPC and board inexpensively. Furthermore, since these FPC and board are manufactured separately, if a design of, for example, only the optical transmitting-receiving board connection FPC 221 is changed, it is possible to correspond to this change by changing only the process of manufacturing the optical transmitting-receiving board connection FPC 221, thereby limiting the effects of changes in design to a smaller range thereof.

The optical transmitter-receiver module 319 and the network card 320 as shown in FIGS. 18 and 19 has a similar configuration to the optical transmitter-receiver module 219 and the network card 220 as shown in FIGS. 16 and 17 without the following items. Therefore, like reference characters of the first example of the second and third embodiments shown in FIGS. 16 and 17 refer to like elements of the second example thereof shown in FIGS. 18 and 19 without differences. In the optical transmitter-receiver module 319 of the second example shown in FIGS. 18 and 19, the TOSA connection FPC 330, the ROSA connection FPC 329, the optical transmitting-receiving board connection FPC 321, and the optical transmitting-receiving board 332 are each constituted of a flex-rigid board. Accordingly, in contrast to a configuration in which the flexible printed circuit boards of the TOSA connection FPC 330, the ROSA connection FPC 329, and the optical transmitting-receiving board connection FPC 321 are soldered onto the optical transmitting-receiving board 332, a soldering operation in manufacture is rendered unnecessary. Accordingly, it is possible to abbreviate periods of manufacturing operations and, furthermore, to prevent occurrences of poor soldering, and occurrences of deficiencies in manufacturing caused by the adverse effects of heat generated on peripheral components during soldering.

Furthermore, in the optical transmitting-receiving modules 219, 319 and the network cards 220, 320 according to the second and third embodiments of the present invention illustrated in FIGS. 16-19, each of the optical transmitting-receiving connection FPCs 221, 321 is connected to an FPC connector 234 attached to the host board 223. This allows each of the optical transmitting-receiving board connection FPCs 221, 321 to be easily mounted onto the host board 223.

Further, in the optical transmitter-receiver modules 219, 319 and the network cards 220, 320 of the second and third embodiments, the TOSAs 227, the ROSAs 228, the optical transmitting-receiving boards 232, 332 and the host boards 223 are respectively connected to the corresponding flexible printed circuit boards. Accordingly, within a length of each of these flexible printed circuit boards, positions of various members can be changed. For example, after each of the members has been connected to each of the flexible printed circuit boards, a position of the bezel 224 can be adjusted to align it with an end face of the optical transmitter-receiver module cabinet 226 on which each of the optical transmitting-receiving boards 232, 332 is mounted.

Moreover, in the optical transmitter-receiver modules 219, 319 and the network cards 220, 320 of the second and third embodiments, a part of the modules and the circuits for optical transmission and reception is configured as an optical transmitter-receiver module. Accordingly, it is possible to provide common specifications for an optical transmitter-receiver such as other network cards and an optical transmitter-receiver module so that any optical transmitter-receiver module having specifications that are identical to those of the optical transmitter-receiver such as other network cards can be used. This enables to reduce any costs in both of the design and manufacture thereof.

Operations of the Optical Transmitter-Receiver Modules and the Network Cards According to the Second and Third Embodiments of the Present Invention The following will describe an example of operations of the optical transmitter-receiver module 219 and the network card 220 illustrated in FIGS. 16A and 17. The optical transmitter-receiver module 219 and the network card 220 are inserted into an expansion slot in an item of equipment such as a personal computer. The optical transmitter-receiver module 219 and the network card 220 transmits and receives data to and from an item of equipment such as an external information communication device via an optical cable connected to the optical cable connection connector 233, which will be described below.

Data is transmitted to the equipment such as the external information communication device as follows. Information that is necessary for data transmission is input as an electrical signal to the optical transmitting-receiving circuit section 222 via the card edge sections 225 inserted into the expansion slot in the item of equipment such as personal computer. The information that is necessary for data transmission input to the optical transmitting-receiving circuit sections 222 as an electrical signal is processed by a chip such as a MAC chip or a PHY chip and input as an electrical signal onto the optical transmitting-receiving circuit section 231 on the optical transmitting-receiving board 232 by way of the optical transmitting-receiving board connection FPC 221. Then, on the basis of the information input into the optical transmitting-receiving circuit section 231, an electrical signal is used to drive the laser diode in the TOSA 227 by way of the TOSA connection FPC 230 so that data may be transmitted as an optical signal to the external information communication device by means of an optical cable.

The data is received from the item of equipment such as the external information communication device as follows. The data from the external information communication device is input as an optical signal by means of the optical cable onto the photodiode in the ROSA 228. The optical signal input onto the photodiode in the ROSA 228 is converted into an electrical signal, which is in turn input by way of the ROSA connection FPC 229 onto the optical transmitting-receiving circuit section 231 of the optical transmitting-receiving board 232. The electrical signal that has been input onto the optical transmitting-receiving circuit section 231 is processed by equipment such as the post-amplifier circuit and input onto the optical transmitting-receiving circuit section 222 on the host board 223 by way of the optical transmitting-receiving board connection FPC 221. The electrical signal that has been input onto the optical transmitting-receiving circuit section 222 is processed by a chip such as a PHY chip or a MAC chip, and output as received data to the item of equipment such as the personal computer by way of the card edge sections 225.

Thus, as described above, in the course of the transmission of data to and reception of data from the external information communication device via the optical cable, a high-frequency electrical signal is transmitted through the signal lines and the connections on the TOSA connection FPC 230, the ROSA connection FPC 229, the optical transmitting-receiving board connection FPC 221, the optical transmitting-receiving board 232, and the host board 223. For example, in circumstances where serial data is transmitted at a high speed such as 10G bits/s, it is necessary to correspond to a signal having a high level of frequency in excess of 10 GHz.

Operations similar to the above operations of the optical transmitter-receiver module 219 and the network card 220 as the first example of the second and third embodiments of the invention is also performed in the optical transmitter-receiver module 319 and the network card 320 as the second example thereof, which are illustrated in FIGS. 18 and 19.

In the optical transmitter-receiver modules 219, 319 and the network cards 220, 320 of the second and third embodiments, the flexible printed circuit board 100 of the first embodiment of the present invention illustrated in FIGS. 7-12 can be applied to the optical transmitting-receiving board connection FPCs 221, 321. Accordingly, by performing high-speed data transmission and reception, a high-quality signal can be transmitted through the connections between the signal lines of the flexible printed circuit board and the FPC connector even if a high-frequency signal is transmitted, thereby facilitating stability in the transmission and reception of data.

Although the flexible printed circuit board connected to the FPC connector, and an optical transmitter-receiver module and an optical transmitter-receiver, which are each equipped with such a flexible printed circuit board, has been described, this invention is not limited thereto. For example, this invention can be applied to a flexible printed circuit board connected to another connector.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a flexible printed circuit board for connecting an exterior connector electrically, said flexible printed circuit board comprising:
    forming an insulation layer;
    forming a first signal wiring layer provided on one side of the insulation layer, said first signal wiring layer including a microstrip line; and
    forming a second signal wiring layer provided on the other side of the insulation layer, said second signal wiring layer including a signal connection terminal for allowing the microstrip line to connect the exterior connector electrically, and a ground conductive section having a ground connection terminal for connecting the exterior connector, said ground connection terminal being arranged away from the signal connection terminal at a predetermined position connection,
    wherein the microstrip line and the signal connection terminal are connected to each other by a wiring via hole, said wiring via hole passing through the insulation layer, the first signal wiring layer, and the second signal wiring layer;
    wherein the microstrip line has a taper section which gradually enlarges a width of the microstrip line toward the wiring via hole in the vicinity of the wiring via hole; and
    wherein the ground conductive section that corresponds to the microstrip line has a taper section with a shape matching the taper section of the microstrip line.

2. The method of manufacturing a flexible printed circuit board according to claim 1, wherein if the exterior connector is mounted on a printed circuit board when the signal connection terminal and the ground connection terminal are connected to the connector, the signal connection terminal and the ground connection terminal are faced at a side of the printed circuit board.

3. The method of manufacturing a flexible printed circuit board according to claim 1, wherein the wiring via hole includes a plurality of the wiring via holes.

4. The method of manufacturing a flexible printed circuit board according to claim 1, wherein the microstrip line includes a pair of microstrip lines and a differential signal is transmitted through the pair of the microstrip lines.

5. The method of manufacturing a flexible printed circuit board according to claim 1, wherein the first signal wiring layer and the ground connection terminal are connected to one another through a ground wiring via hole, said via hole passing through the insulation layer.

6. The method of manufacturing a flexible printed circuit board according to claim 5, wherein the first signal wiring layer and the ground connection terminal are connected to one another through a plurality of ground wiring via holes.

7. A method of manufacturing an optical transmitter-receiver module comprising:
   forming an optical transmitter module that converts an electrical signal into an optical signal and output the converted optical signal; and
   forming an optical receiver module that converts an optical signal into an electrical signal and outputs the converted electrical signal, said optical transmitter module and said optical receiver module being connected to an optical transmitting-receiving circuit board,
   wherein the optical transmitting-receiving circuit board is electrically connected to a connector attached to another board by way of a flexible printed circuit board;
   wherein the flexible printed circuit board includes:
   an insulation layer;
   a first signal wiring layer provided on one side of the insulation layer, said first signal wiring layer including a microstrip line; and
   a second signal wiring layer provided on the other side of the insulation layer, said second signal wiring layer including a signal connection terminal for allowing the microstrip line to connect the exterior connector electrically, and a ground conductive section having a ground connection terminal for connecting the exterior connector, said ground connection terminal being arranged away from the signal connection terminal at a predetermined position connection,
   wherein the microstrip line and the signal connection terminal are connected to each other by a wiring via hole, said wiring via hole passing through the insulation layer, the first signal wiring layer, and the second signal wiring layer;
   wherein the microstrip line has a taper section which gradually enlarges a width of the microstrip line toward the wiring via hole in the vicinity of the wiring via hole; and
   wherein the ground conductive section that corresponds to the microstrip line has a taper section with a shape matching the taper section of the microstrip line.

8. A method of manufacturing an optical transmitter-receiver comprising:
   forming an optical transmitting-receiving circuit board;
   forming an optical transmitter module that converts an electrical signal into an optical signal and output the converted optical signal; and
   forming an optical receiver module the converts an optical signal into an electrical signal and outputs the converted electrical signal, said optical transmitter module and said optical receiver module being connected to an optical transmitting-receiving circuit board; and
   forming a mother board to which the optical transmitter-receiver module is connected,
   wherein the optical transmitting-receiving circuit board is electrically connected to a connector attached to another board by way of a flexible printed circuit board;
   wherein the flexible printed circuit board includes:
   an insulation layer;
   a first signal wiring layer provided on one side of the insulation layer, said first signal wiring layer including a microstrip line;
   a second signal wiring layer provided on the other side of the insulation layer, said second signal wiring layer including a signal connection terminal for allowing the microstrip line to connect the exterior connector electrically, and a ground conductive section having a ground connection terminal for connecting the exterior connector, said ground connection terminal being arranged away from the signal connection terminal at a predetermined position connection; and
   wherein the microstrip line and the signal connection terminal are connected to each other by a wiring via hole, said wiring via hole passing through the insulation layer, the first signal wiring layer, and the second signal wiring layer;
   wherein the microstrip line has a taper section which gradually enlarges a width of the microstrip line toward the wiring via hole in the vicinity of the wiring via hole; and
   wherein the ground conductive section that corresponds to the microstrip line has a taper section with a shape matching the taper section of the microstrip line.

* * * * *